United States Patent
Palm et al.

(10) Patent No.: US 11,070,222 B2
(45) Date of Patent: Jul. 20, 2021

(54) SUCCESSIVE-APPROXIMATION ANALOG-TO-DIGITAL CONVERTER

(71) Applicant: Telefonaktiebolaget LM Ericsson (publ), Stockholm (SE)

(72) Inventors: Mattias Palm, Bara (SE); Lars Sundström, Södra Sandby (SE); Ola Andersson, Svedala (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 16/980,177

(22) PCT Filed: Mar. 19, 2018

(86) PCT No.: PCT/EP2018/056826
§ 371 (c)(1),
(2) Date: Sep. 11, 2020

(87) PCT Pub. No.: WO2019/179592
PCT Pub. Date: Sep. 26, 2019

(65) Prior Publication Data
US 2021/0075435 A1   Mar. 11, 2021

(51) Int. Cl.
*H03M 1/10* (2006.01)
*H04B 1/16* (2006.01)
(Continued)

(52) U.S. Cl.
CPC ............ *H03M 1/1071* (2013.01); *H04B 1/16* (2013.01); *H04W 88/08* (2013.01); *H04W 84/042* (2013.01)

(58) Field of Classification Search
CPC ............ H03M 1/1071; H03M 1/0617; H03M 1/1061; H03M 1/68; H03M 1/804; H04B 1/16; H04W 88/08; H04W 84/042
(Continued)

(56) References Cited

U.S. PATENT DOCUMENTS 6,268,813 B1 * 7/2001 de Wit .................. H03M 1/108
341/120
6,720,903 B2    4/2004 Confalonieri et al.
(Continued)

OTHER PUBLICATIONS

International Search Report dated Feb. 18, 2019 for International Application No. PCT/EP2018/056826 filed on Mar. 19, 2018, consisting of 21-pages.
Zhe Li et al; Calibration for Split Capacitor DAC in SAR ADC; International Conference on ASIC; Oct. 28, 2013; pp. 1-4; Shanghai, China; consisting of 4-pages.
Ruoyu Xu et al; Digitally Calibrated 768-kS/S 10-b Minimum-Size SAR ADC Array with Dithering; Journal of Solid-State Circuits; Sep. 1, 2012; pp. 2129-2140; vol. 47 No. 9; New Jersey, USA; consisting of 12-pages.
(Continued)

*Primary Examiner* — Lee Nguyen
(74) *Attorney, Agent, or Firm* — Christopher & Weisberg, P.A.

(57) ABSTRACT

Disclosed is a SAR ADC (Ai) having an input for receiving an input voltage, a comparator, a first switch network configured to be controlled by the SAR state machine and connected to the input of the SAR ADC and to reference voltage nodes, and a first capacitor network. The first capacitor network has a first node connected to an input of the comparator, a second node, and a bridge capacitor (Cb) connected between the first node and the second node. Furthermore, the first capacitor network comprises a first set of capacitors having a first and a second terminal, wherein the first terminal of each capacitor in the first set is connected to the first node and the second terminal of each capacitor in the first set is connected to the switch network. Moreover, the first capacitor network comprises a second set of capacitors having a first and a second terminal, wherein the first terminal of each capacitor in the second set is connected to the second node and the second terminal of each capacitor in the first set is connected to the switch network. The SAR ADC further comprises a second capacitor network configured to control a gain of the SAR ADC.

18 Claims, 6 Drawing Sheets

(51) Int. Cl.
*H04W 88/08* (2009.01)
*H04W 84/04* (2009.01)

(58) Field of Classification Search
USPC .................................. 455/561; 341/118, 163
See application file for complete search history.

(56) References Cited

U.S. PATENT DOCUMENTS 8,981,973 B2 * 3/2015 Kumar ................ H03M 1/0617
341/118
2012/0001781 A1 1/2012 Scanlan

OTHER PUBLICATIONS

Ling Du et al; Self Calibrated SAR ADC Based on Split Capacitor DAC without the Use of Fractional-Value Capacitor; Transactions on Electrical and Electronic Engineering; Jul. 1, 2013; pp. 408-414; vol. 8 No. 4; Wiley Online Library; consisting of 7-pages.
Frank Ohnhauser; ADCS Based on Successive Approximation; Analog-Digital Converters for Industrial Applications Including and Introduction to Digital-Analog Converters; Jan. 1, 2015; pp. 51-118; Springer-Verlag, Berlin heidelberg; consisting of 22-pages.

* cited by examiner

SUCCESSIVE-APPROXIMATION ANALOG-TO-DIGITAL CONVERTER

CROSS-REFERENCE TO RELATED APPLICATIONS

This application is a Submission Under 35 U.S.C. § 371 for U.S. National Stage Patent Application of International Application Number: PCT/EP2018/056826, filed Mar. 19, 2018 entitled "SUCCESSIVE-APPROXIMATION ANALOG-TO-DIGITAL CONVERTER," the entirety of which is incorporated herein by reference.

TECHNICAL FIELD

The present invention relates to analog-to-digital converters (ADCs), in particular to successive-approximation (SAR) ADCs. Such SAR ADCs can, for instance, be used as sub ADCs in a time-interleaved ADC.

BACKGROUND

An analog-to-digital converter (ADC) is an interface circuit between the analog and the digital signal processing domain that converts an input signal from an analog representation to a digital representation. ADCs are used in many different types of electronic circuits. For instance, ADCs can be used in receiver circuits for converting a received analog signal to a digital representation, which is then subject to further signal processing in a digital signal processor or the like.

One type of ADC that is commonly used to achieve relatively high sampling rates is the so-called time-interleaved ADC (TI-ADC). A TI-ADC comprises a number M of nominally identical sub ADCs that each operate on every M:th input sample in a time-interleaved manner. If the TI-ADC operates at a sampling rate $f_s$, each sub ADC operates at a considerably lower sampling rate $f_{s,sub}=f_s/M$.

A drawback with time-interleaving is the high matching requirement between sub ADCs in time (sampling moment), offset and gain. Estimation and correction for time mismatch can be avoided by having a sample-and-hold (S/H) circuit in-front of the ADC. The offset and gain mismatch can be handled in the digital domain, corrected by a subtraction and multiplication, respectively. In particular, the multiplication consumes power and silicon area, and alternative methods may therefore be preferred.

The sub ADC can for instance be implemented using a successive approximation (SAR) ADC with a capacitive digital-to-analog converter (DAC). A straight-forward implementation of the DAC utilizes a bank of binary-weighted, or radix-2, capacitors. The DAC converts a digital word of B bits into a voltage that is fed into a comparator for comparison with a sampled input voltage. The least significant bit (LSB) of that digital word has a corresponding capacitor with weight 1 (i.e. has a capacitance C, where C is some unit capacitance value) and the most significant bit (MSB) of that digital word has a corresponding capacitor with weight $2^{B-1}$ (i.e. has a capacitance $2^{B-1}C$).

U.S. Pat. No. 6,720,903 B2 discloses a method of operating an SAR-type analog-to-digital converter to match the dynamic range of an input voltage signal to be converted with the full scale range of the converter, the converter including at least one array of binary weighted capacitors. The method includes the step of obtaining a digital gain code that represents the ratio between the full scale range and the dynamic range of the voltage signal to be converted, applying the voltage signal to be converted to the capacitor array so as to charge with the voltage signal to be converted only those array capacitors having the same binary weights as the bits of the gain code that have a selected binary value, and selectively coupling the capacitors of the array to one of a first and second predetermined reference voltage terminals according to an SAR technique, to obtain an output digital code corresponding to the input voltage signal. It should be noted that the gain control achieved by the SAR-ADC in U.S. Pat. No. 6,720,903 B2 is relatively coarse. If used in a as a sub ADC in a TI-ADC, a finer degree of gain control may be needed, depending on requirements of a given application.

A problem with the binary-weighted capacitor bank is that the size grows exponentially with the number of bits. For large B, the DAC consumes a large power, silicon area and is complicated to layout due to matching requirements. Another side effect is that the circuit driving the ADC input needs to supply a large current to charge the large capacitors during the sampling phase.

To reduce the above-mentioned problems with a binary-weighted capacitor bank, the capacitor bank can be split into two sections with a bridge capacitor connected between them, resulting in a bridged capacitor bank. The two sections are commonly referred to as the main-DAC (MDAC) and sub-DAC (SDAC). The SDAC interpolates between the values of the MDAC. One may relate the MDAC and SDAC gains through a bridge ratio, here defined as the gain of the MDAC LSB to the comparator input divided by the gain of the SDAC MSB to the comparator input. To have a linear DAC transfer (equidistant quantization levels), it is important that the radix is 2 for all capacitors controlled by the digital word being converted. If the bridge ratio differs from its ideal value, the MDAC and SDAC may still be individually linear (radix-2), but the overall DAC transfer is non-linear. To ensure a relatively accurate bridge ratio, the bridge capacitor should be matched with the other capacitors in the DAC. Different techniques for achieving relatively well-matched capacitors exist, such as implementing each capacitor as parallel connections of a number of smaller unit capacitors. However, perfect matching cannot be achieved in practice, and the bridge ratio will not be perfectly accurate. Parasitics also contribute to inaccuracy of the bridge ratio. Hence, an inaccuracy in the bridge ratio may therefore need to be estimated and corrected.

SUMMARY

According to embodiments disclosed herein, bridged capacitor banks are utilized that have additional capacitors compared with conventional bridged capacitor banks. These additional capacitors can be used in various ways to compensate for matching problems, such as gain errors between sub ADCs or bridge-ratio inaccuracies.

According to a first aspect, there is provided SAR comprising an input for receiving an input voltage, a comparator, a SAR state machine connected to an output of the comparator, a first switch network configured to be controlled by the SAR state machine and connected to the input of the SAR ADC and to reference voltage nodes, and a first capacitor network. The first capacitor network comprises a first node connected to an input of the comparator, a second node, and a bridge capacitor connected between the first node and the second node. Furthermore, the first capacitor network comprises a first set of capacitors having a first and a second terminal, wherein the first terminal of each capacitor in the first set is connected to the first node and the second terminal of each capacitor in the first set is connected to the first switch network. Moreover, the first capacitor network comprises a second set of capacitors having a first and a second terminal, wherein the first terminal of each capacitor in the second set is connected to the second node and the second terminal of each capacitor in the first set is connected to the first switch network. The SAR state machine is configured to control the first switch network such that the input voltage is sampled on one or more of the capacitors in the union of the first and the second set during a first phase of a sampling clock period.

Furthermore, the SAR state machine is configured to control the first switch network such that SAR A/D conversion is performed during a subsequent second phase of the sampling clock period. The SAR ADC further comprises a second capacitor network connected to the second node of the first capacitor network and configured to control a gain of the SAR ADC.

The second capacitor network may comprise a capacitor ladder. The capacitor ladder may comprise a set of k connection points, in the following numbered from 1 to k. The 1:st connection point may be connected to the second node of the first capacitor network. For each $j=1, \ldots, k-1$, the capacitor ladder may comprise a bridge capacitor connected between connection point j and connection point j+1. For each $j=1, \ldots, k$, the capacitor ladder may comprises a j:th capacitor having a first terminal connected to connection point j. The second capacitor network may comprise a capacitor connected between connection point k and a ground node. The second capacitor network may comprise a capacitor connected between connection point 1 and a ground node.

The SAR ADC may comprise a second switch network. For each $j=1, \ldots, k$, the second switch network may comprise a j:th switch configured to connect a second terminal of the j:th capacitor of the second capacitor network to a ground node during the second phase of the sampling clock period, and to selectively connect the second terminal of the j:th capacitor of the second capacitor network to the ground node or the input of the SAR ADC during the first phase of the sampling clock period to control the gain of the SAR ADC. Furthermore, the SAR ADC may comprise a third switch network configured to connect the k connection points of the second capacitor network to the ground node during the first phase of the sampling clock period and to disconnect the k connection points of second capacitor network from the ground node during the second phase of the sampling clock period.

The SAR ADC may comprise a test sequence interface configured to provide a binary test sequence during a plurality of consecutive sampling clock periods. Each of the plurality of sampling clock periods may have an associated sample of the binary test sequence. The first capacitor network may comprise a first test-signal capacitor having a first and a second terminal, wherein the first terminal is connected to the first node of the first capacitor network. The first capacitor network may comprise a second test-signal capacitor having a first and a second terminal, wherein the first terminal is connected to the second node of the first capacitor network. For each of the plurality of consecutive sampling clock periods, the second terminal of the first test-signal capacitor may be configured to be supplied with a first voltage representing the associated sample of the binary test sequence, and the second terminal of the second test-signal capacitor may be configured to be supplied with a second voltage representing the associated sample of the binary test sequence, such that a contribution of the first voltage at the input of the comparator is counteracted.

The first voltage and the second voltage may be selected from a positive reference voltage and a negative reference voltage in response to the binary test sequence.

In some embodiments, the first test-signal capacitor is configured to be supplied with the first voltage in one of the first phase and the second phase of the sampling clock period, the second terminal of the second test-signal capacitor is configured to be supplied with the second voltage in the same one of the first phase and the second phase of the sampling clock period, and the first voltage and the second voltage have opposite polarity.

In some embodiments, the second terminal of the first test-signal capacitor is configured to be supplied with the first voltage in one of the first phase and the second phase of the sampling clock period, the second terminal of the second test-signal capacitor is configured to be supplied with the second voltage in the other one of the first phase and the second phase of the sampling clock period, and the first voltage and the second voltage have the same polarity.

The binary test sequence may be a pseudo-random binary sequence.

The SAR ADC may comprise circuitry configured to estimate a bridge ratio based on output samples the SAR ADC generated during said plurality of sampling clock periods.

According to a second aspect, there is provided a time-interleaved ADC comprising a plurality of sub ADCs, each implemented as the SAR ADC according to the first aspect.

According to a third aspect, there is provided a receiver circuit comprising the SAR ADC of the first aspect or the time-interleaved ADC according to the second aspect.

According to a fourth aspect, there is provided an electronic apparatus comprising the SAR ADC of the first aspect, the time-interleaved ADC of the second aspect, or the receiver circuit of the third aspect. The electronic apparatus may be a communication apparatus, such as but not limited to a wireless communication device or a base station for a cellular communications system.

Further embodiments are defined in the dependent claims. It should be emphasized that the term "comprises/comprising" when used in this specification is taken to specify the presence of stated features, integers, steps, or components, but does not preclude the presence or addition of one or more other features, integers, steps, components, or groups thereof.

DETAILED DESCRIPTION

In this description, reference is made to various voltage levels. As is well known to a person skilled in the art of electronic design, what voltage level is considered to be zero volts, or "ground", can be arbitrarily selected. Often, ground is used to denote the lowest voltage level available in an integrated circuit, but this is not the case in this description. In this description, ground has been selected to be in the middle between two reference voltage levels. These reference voltage levels are referred to as a positive reference voltage $+V_{ref}$ and a negative reference voltage $-V_{ref}$.

Figure 1:
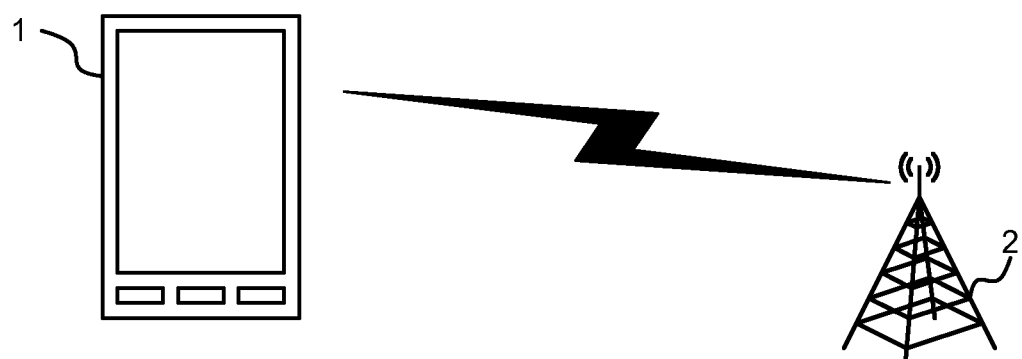
FIG. 1 illustrates a communication environment.

FIG. 1 illustrates a communication environment wherein embodiments of the present invention may be employed. A wireless communication device 1, or wireless device 1 for short, of a cellular communications system is in wireless communication with a radio base station 2 of the cellular communications system. The wireless device 1 may be what is generally referred to as a user equipment (UE). The wireless devices 1 is depicted in FIG. 1 as a mobile phone, but may be any kind of device with cellular communication capabilities, such as a tablet or laptop computer, machine-type communication (MTC) device, or similar. Furthermore, a cellular communications system is used as an example throughout this disclosure. However, embodiments of the present invention may be applicable in other types of systems as well, such as but not limited to WiFi systems.

The radio base station 2 and wireless device 1 are examples of what in this disclosure is generically referred to as communication apparatuses. Embodiments are described below in the context of a communication apparatus in the form of the radio base station 2 or wireless device 1. However, other types of communication apparatuses can be considered as well, such as a WiFi access point or WiFi enabled device.

Figure 2:
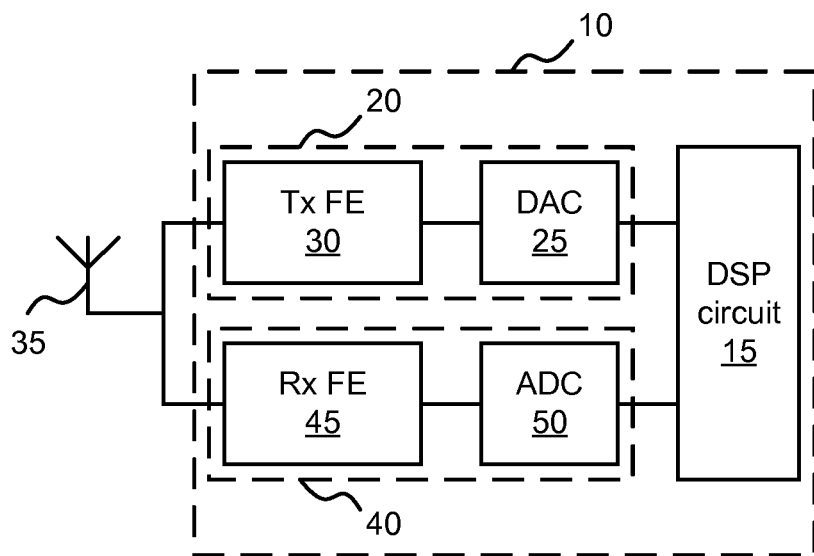
FIG. 2 illustrates a transceiver circuit.

FIG. 2 is a block diagram of an embodiment of a transceiver circuit 10, which can be comprised in a communication apparatus, such as the radio base station 2 or the wireless device 1. In the embodiment illustrated in FIG. 2, the transceiver circuit 10 comprises a digital signal processing (DSP) circuit 15. The DSP circuit 15 may e.g. be what is commonly referred to as baseband processor. The DSP circuit 15 may e.g. be configured to perform various digital signal processing tasks, such as one or more of coding, decoding, modulation, demodulation, fast Fourier transform (FFT), inverse FFT (IFFT), mapping, demapping, etc.

Furthermore, in the embodiment illustrated in FIG. 2, the transceiver circuit 10 comprises a transmitter circuit 20. The transmitter circuit 20 comprises a digital-to-analog converter (DAC) 25. The DAC 25 is connected to the DSP circuit 15 and configured to receive, as an input signal of the DAC 25, a digital representation of a signal to be transmitted from the DSP circuit 15. The DAC 25 is further configured to convert the signal to be transmitted to an analog representation, which is an output signal of the DAC 25. The transmitter circuit 20 also comprises a transmitter (Tx) frontend (FE) circuit 30 connected between the DAC 25 and an antenna 35. The Tx FE circuit 30 is configured to transform the output signal from the DAC 25 to a format suitable for transmission via the antenna 35. This may include operations such as frequency upconversion, filtering, and/or amplification. The Tx FE circuit 30 may comprise one or more mixers, filters, and/or amplifiers, such as power amplifiers (PAs), to perform such operations. The design of such Tx FE circuits is, per se, well known to a person skilled in the field of radio transceiver design, and is not discussed herein in any further detail.

Moreover, in the embodiment illustrated in FIG. 2, the transceiver circuit 10 comprises a receiver circuit 40. The receiver circuit 40 comprises a receiver (Rx) FE circuit 45 connected to the antenna 35. Furthermore, the receiver circuit 40 comprises an ADC 50. The ADC 50 is connected between the Rx FE circuit 45 and the DSP circuit 15. The Rx FE circuit is 45 is configured to is transform a signal received via the antenna 35 to a format suitable to be input to the ADC 50. This may include operations such as frequency downconversion, filtering, and/or amplification. The Rx FE circuit 45 may comprise one or more mixers, filters, and/or amplifiers, such as low-noise amplifiers (LNAs), to perform such operations. The design of such Rx FE circuits is, per se, well known to a person skilled in the field of radio transceiver design, and is not discussed herein in any further detail. The ADC 50 is configured to receive its (analog) input signal from the Rx FE circuit, and convert it to a digital representation to generate the digital output signal of the ADC 50. This digital output signal of the ADC 50 is input to the DSP circuit 15 for further digital signal processing.

Figure 3:
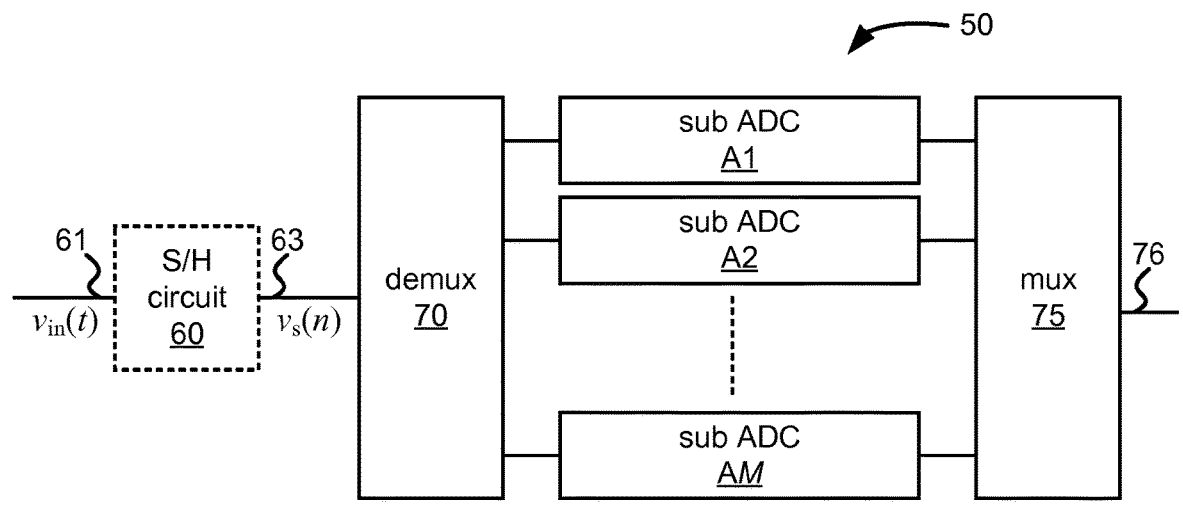
FIG. 3 illustrates a TI-ADC.

FIG. 3 is a block diagram of the ADC 50 according to some embodiments. The ADC 50 may, for instance, be integrated on an integrated circuit. It comprises a plurality of sub ADCs A1-AM configured to operate in a time-interleaved manner. The integer M denotes the number of sub ADCs A1-AM. As illustrated in FIG. 3, the ADC 50 may comprise an S/H circuit 60 that is common to all sub ADCs A1-AM. In FIG. 3, the S/H circuit has an input 61 configured to receive an input voltage $v_{in}$ (t) representing the analog input signal of the ADC 50 at (continuous) time t. Furthermore, it has an output 63 configured to output a sampled input voltage $v_s$ (n) representing the analog input signal at sampling instants nT, where n is an integer valued sequence index and T is the sampling period time of the ADC 50. The ADC 50 may comprise an analog demultiplexer 70 configured to distribute samples of $v_s$ (n) to the correct sub ADC Ai. It should be noted that in some embodiments, the S/H circuit 60 may be omitted, for instance by having S/H circuits in the sub ADCs A1-AM instead. Moreover, the ADC 50 may comprise a digital multiplexer 75 configured to interleave the outputs from the sub ADCs A1-AM in the correct order and output the interleaved output sequence on an output 76 as the digital output signal of the ADC 50.

Before going into more detailed embodiments of the sub ADCs A1-AM, some analyses of bridged capacitor banks are first discussed.

Figure 4:
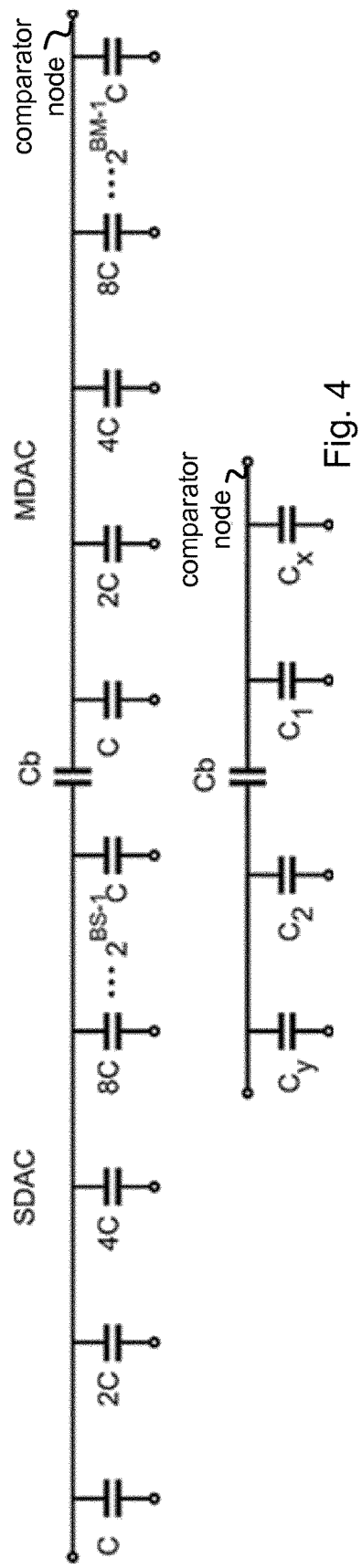
FIG. 4 illustrates a bridged capacitor bank and an equivalent representation.

FIG. 4 shows, in the upper part, an example of a bridged capacitor bank with the SDAC part on the left and the MDAC part on the right. The bridge capacitor has the capacitance $C_b$, and the each of the other capacitors has a capacitance that is an integer multiple of a unit capacitance C. BM denotes the number of bits in the MDAC, and BS denotes the number of bits in the SDAC. The right-most node is connected to a comparator (not shown) and is referred to as the comparator node. The lower part of FIG. 4 shows an equivalent representation of the bridged capacitor bank. $C_1$ is the capacitance of the smallest capacitor (or LSB capacitor) of the MDAC and $C_x$ is the sum of the capacitances of the other capacitors of the MDAC. $C_2$ is the capacitance of the largest capacitor (or MSB capacitor) of the SDAC and $C_y$ is the sum of the capacitances of the other capacitors of the SDAC. It should be noted that the representation in the lower part of FIG. 4 is more general and may represent a bridged capacitor bank with other capacitance values than those shown in the upper part of FIG. 4. In the following, the letter C with an index is used interchangeably to represent a capacitance value and for the capacitor having that capacitance value. When the capacitor banks shown in drawings are in use, the bottom-nodes of the capacitors (other than $C_b$), which appear unconnected (or "floating") in the drawings such as FIG. 4, are to be connected voltage sources that can supply electrical charge to them. Such voltage sources can for instance be a S/H circuit that supplies a sampled input voltage, a reference voltage source that supplies a positive or negative reference voltage, or a source that provides a signal ground. The connections can be made via switches that can switch the nodes of the capacitors between different such voltage sources during the operation of the ADC in which the bridged capacitor bank is comprised. Such connections and voltage sources are omitted in drawings of capacitor banks for simplicity, but are assumed in the following analyses.

The bridge ratio is found by applying a step at the input of $C_1$ and $C_2$ and evaluating their contributions at the comparator node. The gain $H_1$ to the comparator node for $C_1$ is given by $$H_1 = \frac{C_1(C_y + C_b + C_2)}{C_y(C_x + C_b + C_1) + C_x(C_b + C_2) + C_b(C_1 + C_2) + C_1 C_2} \quad (1)$$

The gain $H_2$ to the comparator node for $C_2$ is given by $$H_2 = \frac{C_2 C_b}{C_y(C_x + C_b + C_1) + C_x(C_b + C_2) + C_b(C_1 + C_2) + C_1 C_2} \quad (2)$$

The bridge ratio is given by the ratio $$r = \frac{H_1}{H_2} = \frac{C_1(C_y + C_b + C_2)}{C_2 C_b} \quad (3)$$

For a given desired bridge ratio, the capacitance value of the bridge capacitor can be calculated as $$C_b = \frac{C_1(C_2 + C_y)}{C_2 r - C_1} \quad (4)$$

Figure 5:
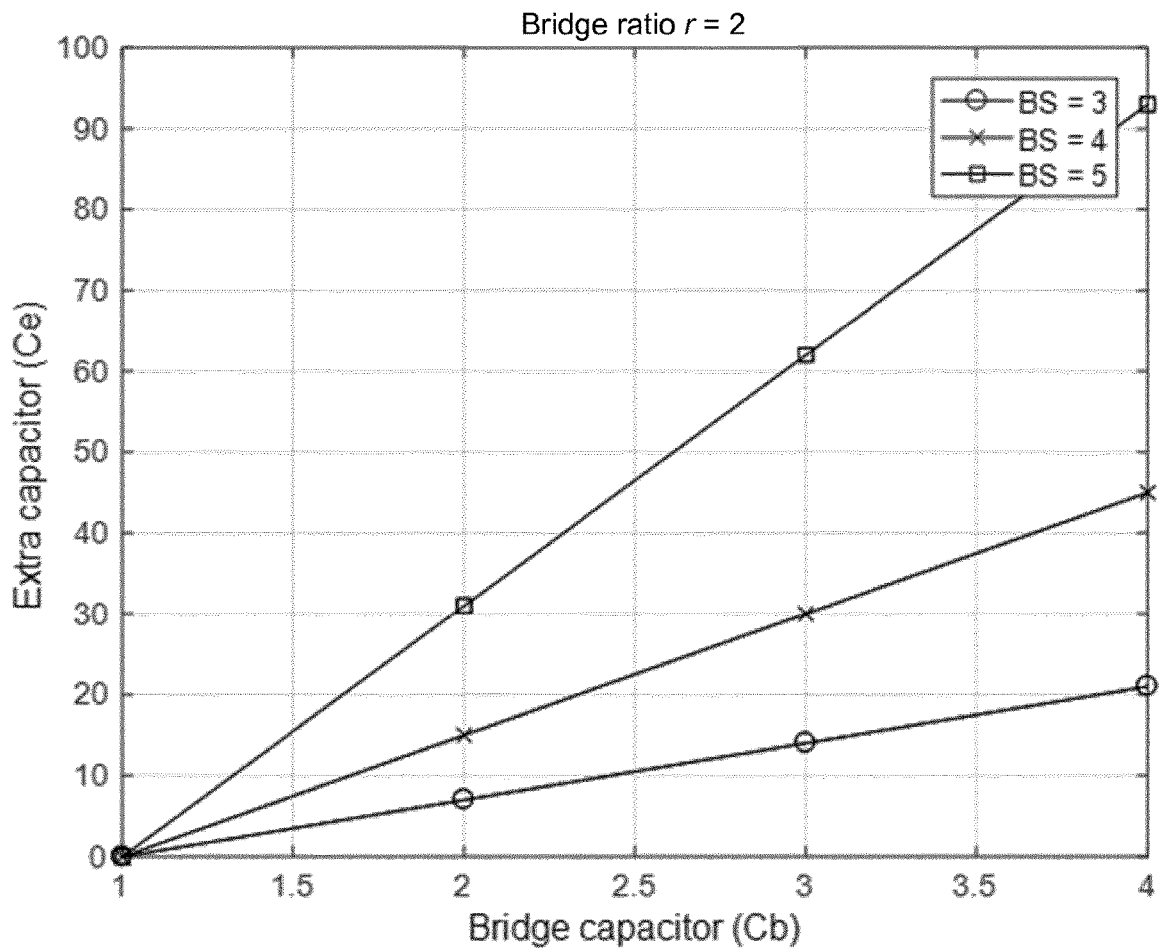
FIG. 5 shows plots of relations between capacitance values for a bridge ratio of 2.
Figure 6:
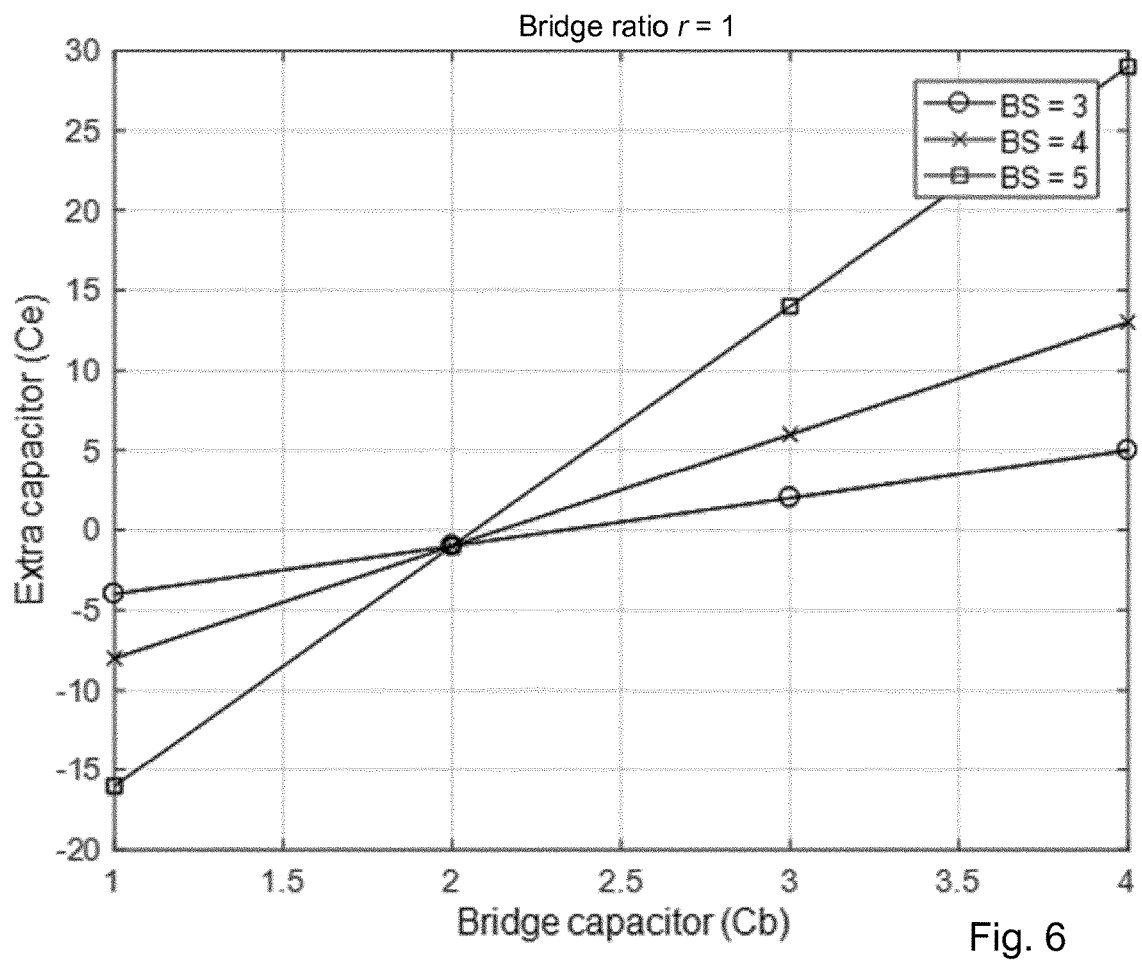
FIG. 6 shows plots of relations between capacitance values for a bridge ratio of 1.

In the following, a normalized measure of capacitance is used where the unit capacitance C=1 for simplicity, but without loss of generality. Suppose an extra capacitor $C_e$ (not shown in FIG. 4) is added to the SDAC, the following holds for a binary weighted capacitor bank $C_1=1$ $C_2=2^{BS-1}$ $C_y=(2^{BS-1}-1)+C_e \quad (5)$ Inserting the above relations into the bridge capacitor equation, the capacitance $C_e$ is given by $C_e = C_b(2^{BS-1}r-1)+1-2^{BS} \quad (6)$ $C_e$ is the capacitance in the SDAC to (signal) ground in addition to the binary weighted part with BS bits. $C_e$ is plotted for BS=3, 4, 5 with r=2 in FIG. 5 and r=1 in FIG. 6, where the solutions for integer $C_b$ and $C_e$ are marked. It can be observed in FIG. 5 that for r=2 and $C_b$=1 (or, in other words, $C_b$ is equal to the unit capacitance C, which is 1 in the normalized capacitance measure used in the analysis), $C_e$=0. That is, no extra capacitor $C_e$ should be added to achieve a bridge ratio of 2 when the bridge capacitor has the unit capacitance C. Furthermore, it can be observed from FIG. 6 that for r=1, the minimum integer value of $C_b$ that results in a non-negative value of $C_e$ is 3. That is, if the bridge capacitor is implemented by parallel connection of an integer number of unit capacitors, each having the unit capacitance C, the number of parallel-connected unit capacitors need to be at least 3.

Figure 7:
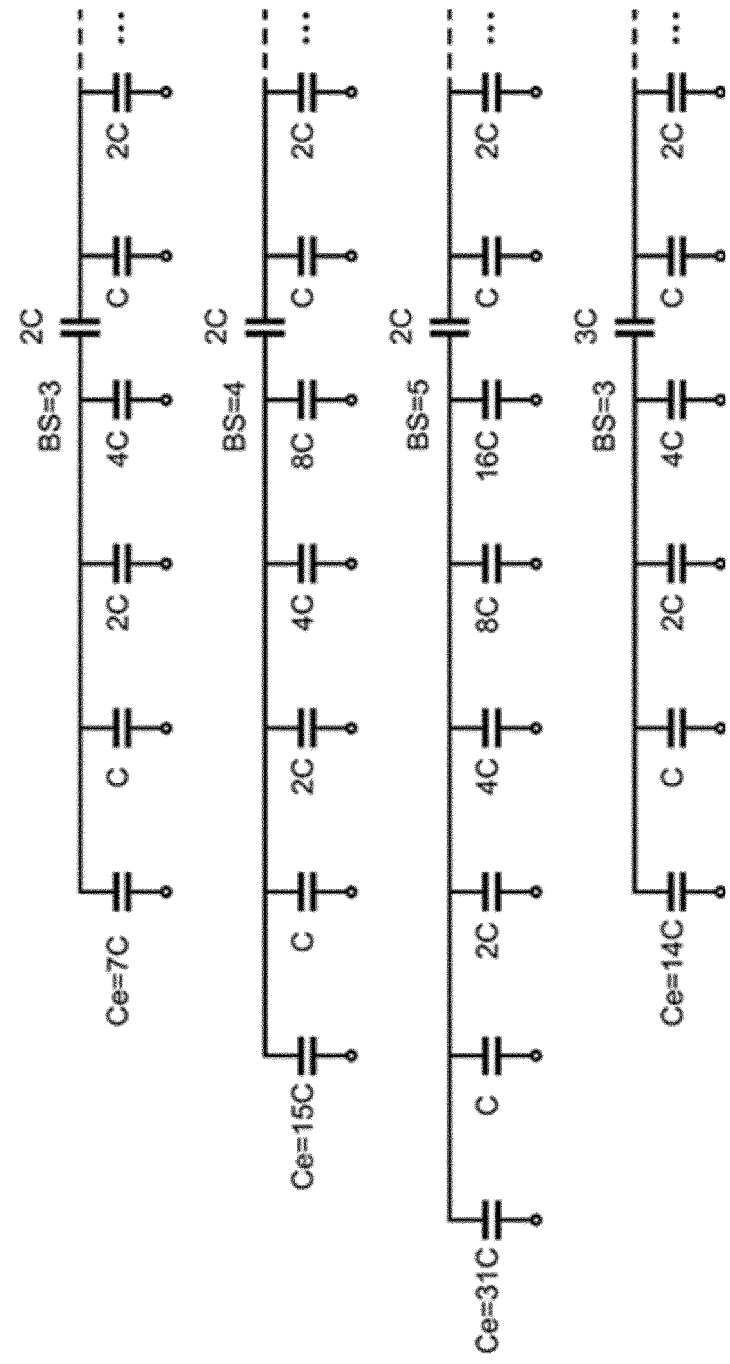
FIGS. 7-8 illustrate different bridged capacitor banks.
Figure 8:
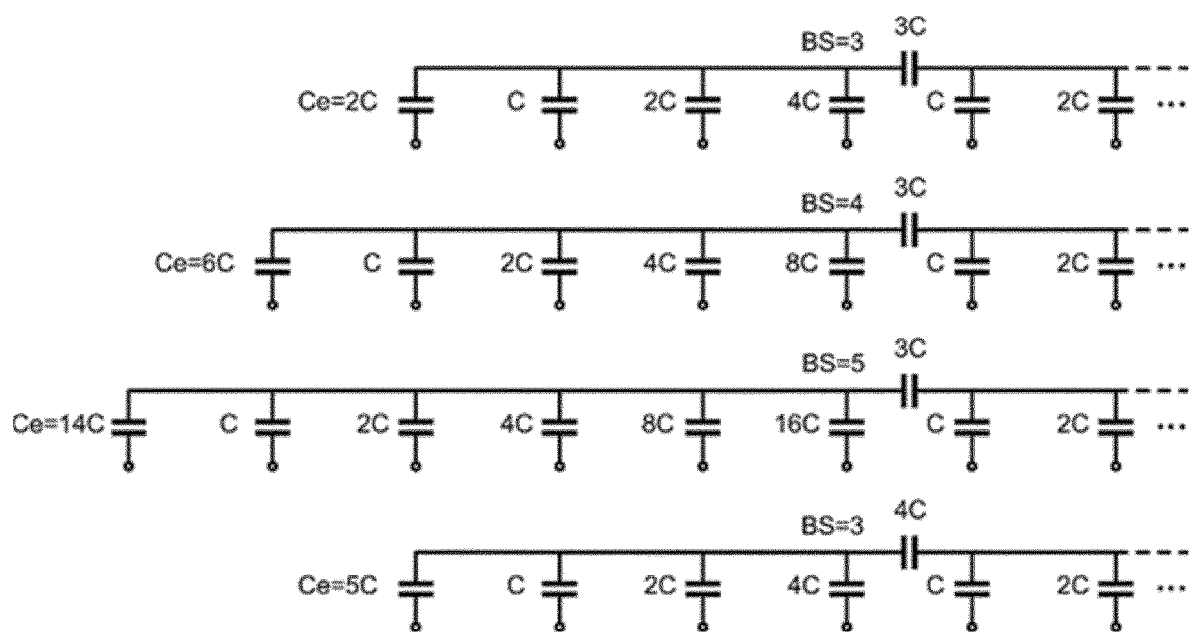

Exemplary capacitor banks are shown in FIG. 7 for r=2 and in FIG. 8 for r=1. Note again that, in use, the bottom nodes of the capacitors, including $C_e$, are not floating.

For r=2, a bridge ratio of two is implemented, which means that all capacitors give a binary weighted contribution at the comparator input.

For r=1, a bridge ratio of unity is achieved. This means that the capacitor with highest capacitance on the SDAC side and the capacitor with the lowest capacitance on the MDAC side have equal weight, while the other capacitors are binary weighted.

An insight that can be drawn as a conclusion of the analyses above is that, for a given desired bridge ratio, it is possible to add one or more additional capacitors (above represented by the additional capacitor $C_e$) by carefully selecting the capacitance of the bridge capacitor $C_b$. This insight is exploited in embodiments described below.

Figure 9:
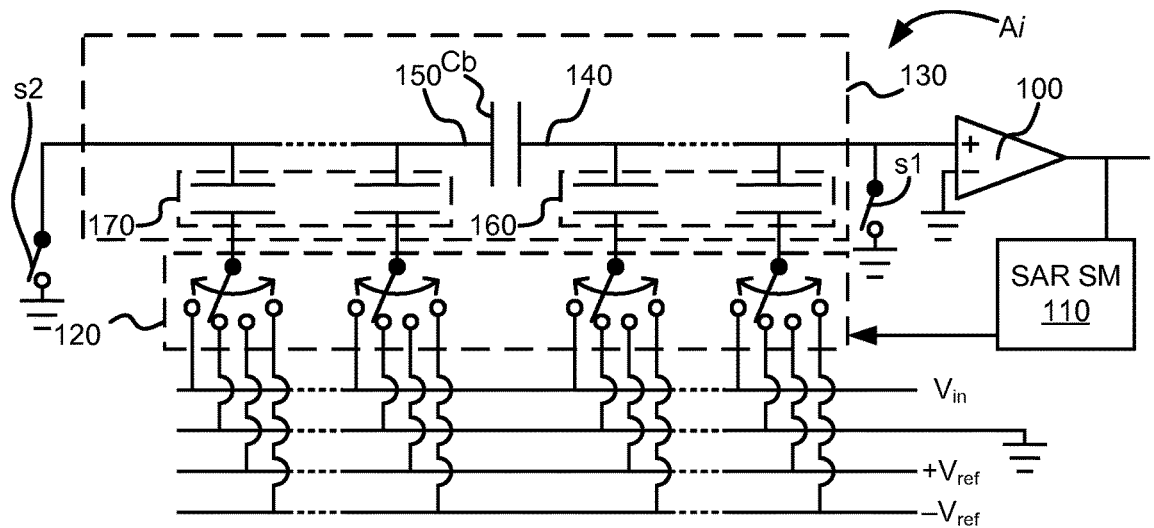
FIG. 9 illustrates a SAR ADC.

FIG. 9 illustrates part of a SAR-ADC according to some embodiments. To indicate that the SAR ADC may be used as any one of the sub ADC A1-AM in the TI-ADC 50 (FIG. 3), the reference sign Ai is used for the SAR-ADC in FIG. 9. In FIG. 9, the SAR ADC Ai comprises an input for receiving an input voltage $V_{in}$. Furthermore, it comprises a comparator 100 and an SAR state machine 110 connected to an output of the comparator 100. Moreover, it comprises a first switch network 120 configured to be controlled by the SAR state machine 110. The first switch network 120 is connected to the input of the SAR ADC Ai and to reference voltage nodes $+V_{ref}$ and $-V_{ref}$. The SAR ADC Ai further comprises a first capacitor network 130. The first capacitor network 130 is built up as a bridged capacitor bank as discussed above. It comprises a first node 140 connected to an input of the comparator 100 and a second node 150. It further comprises a bridge capacitor Cb connected between the first node 140 and the second node 150. Moreover, it comprises a first set 160 of capacitors and a second set 170 of capacitors. The capacitors in the first set 160 each has a first and a second terminal, wherein the first terminal is connected to the first node 140 and the second terminal is connected to the first switch network 120. In FIG. 9, the first terminal is directed up and the second terminal is directed down. The capacitors in the second set 170 each has a first and a second terminal, wherein the first terminal is connected to the second node 150 and the second terminal is connected to the first switch network 120. In FIG. 9, the first terminal is directed up and the second terminal is directed down. The SAR state machine (SM) 110 is configured to control the first switch network 120 such that the input voltage $V_{in}$, is sampled on one or more of the capacitors in the union of the first and the second set 160, 170 during a first phase of a sampling clock period. In some embodiments, the SAR SM 110 is configured to control the switches in the first switch network 120 to connect the second terminal of each capacitor in the first set 160 and the second set 170 to the input of the SAR ADC Ai during the first phase of the sampling clock period. Thereby, the input voltage $V_{in}$ is sampled on all of these capacitors. In some embodiments, the SAR SM 110 is configured to control the switches in the first switch network 120 to connect the second terminals of a subset of the capacitors in the first set 160 and the second set 170 to the input of the SAR ADC Ai during the first phase of the sampling clock period. Furthermore, in these embodiments, the SAR SM 110 is configured to control the switches in the first switch network 120 to connect the second terminals of the remaining capacitors in the first set 160 and the second set 170 to a ground node during the first phase of the sampling clock period. By selecting which capacitors are part of the subset whose second terminals are connected to the input of the SAR ADC Ai, a coarse gain control of the SAR ADC Ai can be obtained, similar to what is described in U.S. Pat. No. 6,720,903 B2. During the first phase of the sampling clock period, switches s1 and s2, shown in FIG. 9, may be controlled to connect the first node 140 and the second node 150, respectively, to ground nodes to allow a net flow of electrical charge to and from these nodes. Moreover, the SAR SM 110 is configured to control the switches in the first switch network 120 such that SAR analog-to-digital, A/D, conversion is performed during a subsequent second phase of the sampling clock period. For example, assuming a binary-weighted architecture, the second terminal of each capacitor is initially (i.e. at the start of the second phase of the sampling clock period) connected to ground. Furthermore, the first node 140 and the second node 150 are disconnected from ground by opening switches s1 and s2. The comparator is then allowed to settle. If the output of the comparator is 'high', or '1', the MSB of the output sample is set to '1' and the second terminal of the corresponding capacitor is connected to $-V_{ref}$. If the output of the comparator is 'low', or '0', the MSB of the output sample is set to '0' and the second terminal of the corresponding capacitor is connected to $+V_{ref}$. Subsequently, the comparator is again allowed to settle. If the output of the comparator is 'high', or '1', the second most significant bit, or "MSB−1" of the output sample is set to '1' and the second terminal of the corresponding capacitor is connected to $-V_{ref}$. If the output of the comparator is 'low', or '0', the MSB−1 of the output sample is set to '0' and the second terminal of the corresponding capacitor is connected to $+V_{ref}$. This procedure is iterated for each bit, in the order of decreasing significance, until all bits of the output sample have been determined. SAR A/D conversion procedures such as that outlined above are well known and therefore not described in any further detail herein.

Figure 10:
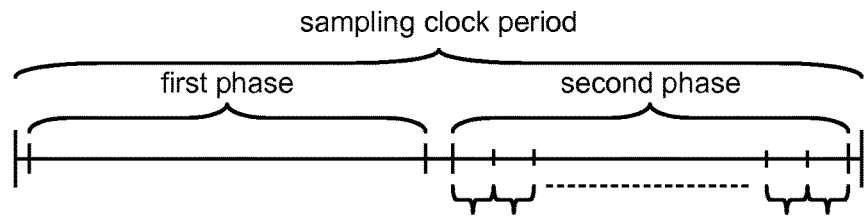
FIG. 10 illustrates a sampling clock period.

FIG. 10 illustrates how the sampling clock period is divided into the first and the second phase, possibly with some guard interval in between them. Furthermore, it is illustrated how the second phase is in turn divided into sub intervals in which the individual bits are determined. In FIG. 10, the bits MSB, MSB−1, LSB+1 (second least significant bit), and LSB are explicitly indicated. The dotted line represents all of the bits in between MSB−1 and LSB+1.

As described above, the capacitance value of the bridge capacitor $C_b$ can be selected in such a way that an additional capacitive circuit (above referred to as capacitor $C_e$) can be connected to the second node 150.

Figure 11:
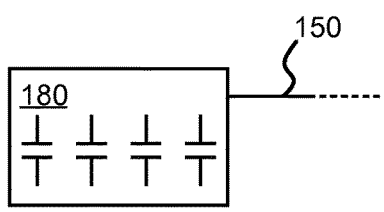
FIG. 11 illustrates a capacitor network.

In some embodiments, the SAR ADC Ai further comprises a second capacitor network 180 connected to the second node 150 of the first capacitor network and configured to control a gain of the SAR ADC Ai. This is illustrated in FIG. 11. As described in further detail below, this second capacitor network can be used for fine gain control of the SAR ADC Ai. Coarse gain control can be obtained as outlined above with reference to U.S. Pat. No. 6,720,903 B2.

Figure 12:
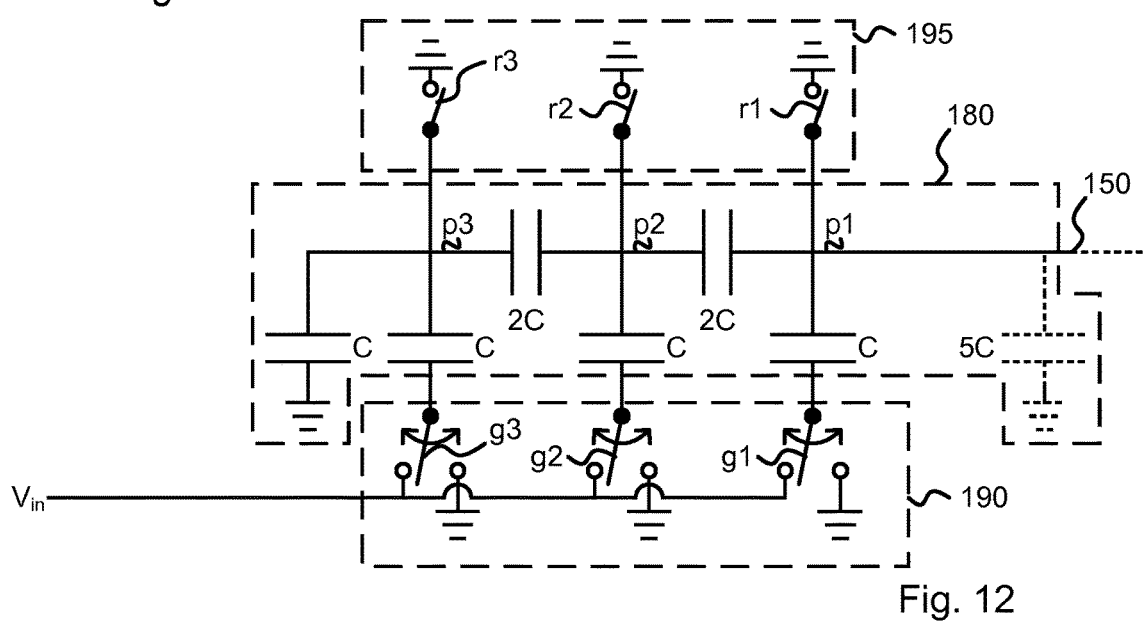
FIG. 12 illustrates a capacitor network and switches.

In some embodiments, the second capacitor network 180 comprises a capacitor ladder. An example of this is illustrated in FIG. 12. In FIG. 12, the capacitor ladder comprises a set of k connection points, in the following numbered from 1 to k. In the example shown, k=3, but any number of connection points may be used. In FIG. 12, the j:th connection point is labeled with the reference sign pj. The 1:st connection point p1 is connected to the second node 150 of the first capacitor network. For each j=1, . . . , k−1, the capacitor ladder comprises a bridge capacitor connected between the j:th connection point pj and the (j+1):th connection point p(j+1). Furthermore, for each j=1, . . . , k, the second capacitor network comprises a j:th capacitor having a first terminal connected to the j:th connection point pj. Furthermore, the second capacitor network 180 may comprise a capacitor connected between the k:th connection point pk and a ground node (i.e. the leftmost capacitor shown in FIG. 12). In the example shown in FIG. 12, the bridge capacitors have the capacitance 2C and the other capacitors in the capacitor ladder, including the capacitor connected between pk and ground, have capacitance C. This is a so called C-2C ladder structure. Regardless of how large the C-2C ladder is, i.e. how many connection points it has, the capacitance of the C-2C ladder seen from connection point p1 is 2C.

In order to get the desired total capacitance of the second capacitor network 180, an additional capacitor might need to be added, for example between p1 and ground. This is illustrated in FIG. 12 with an optional capacitor having the capacitance 5C. If this capacitance is included, the total capacitance of the second capacitor network 180 seen at connection point p1 is 7C. Hence, referring to FIGS. 5 and 7, this particular example of the second capacitor network would be suitable for a 3-bit SDAC with Cb=2C and a bridge ratio of 2 in the first capacitor network 130 (see FIG. 5, lower graph, and FIG. 7, the topmost bridged capacitor bank). To be suitable in other scenarios, the capacitance value should be adjusted accordingly. As illustrated in FIG. 12, the SAR ADC Ai may comprise a second switch network 190. For each j=1, k, the second switch network comprises a j:th switch gj. The switch gj is configured to connect a second terminal of the j:th capacitor of the second capacitor network 180 to ground during the second phase of the sampling clock period. The switch gj is further configured to selectively connect the second terminal of the j:th capacitor of the second capacitor network to the ground node or the input of the SAR ADC Ai during the first phase of the sampling clock period. By controlling which of the 1:st capacitor to the k:th capacitor of the capacitor ladder have its second node connected to the input of the SAR ADC Ai during the first phase of the sampling clock period, the gain of the SAR ADC Ai is controlled. as discussed above, this provides a finer control of the gain than controlling which of the capacitors in the first set 160 and the second set 170 (FIG. 9) are used to sample the input voltage $V_{in}$ during the first phase of the sampling clock period. Increasing the total number k of connection points pj (i.e. increasing the size of the capacitor ladder) increases the resolution of the gain control.

As is also illustrated in FIG. 12, the SAR ADC may comprise a third switch network 195 configured to connect the k connection points pj of the second capacitor network 180 to ground during the first phase of the sampling clock period. Thereby, a net flow of electrical charge to and from these connection points is enabled during the first phase of the sampling clock period. Furthermore, the third switch network 195 is configured to disconnect the k connection points p1-p3 of second capacitor network 180 from ground during the second phase of the sampling clock period. Thereby, a net flow of electrical charge to and from these connection points is disabled during the second phase of the sampling clock period.

Above, embodiments are described with reference to FIGS. 11-12 where the possibility to add additional capacitance to the second node 150 is utilized for controlling the gain of the SAR ADC Ai. Alternatively or additionally, said possibility can be utilized for other purposes. One such purpose is to inject a test signal for estimating the bridge ratio of the first capacitor network. In essence, an additional capacitor is added to each side of the capacitor and a known test sequence p[n] is injected into each of these capacitors in such a way that the contributions due to the test sequence p[n] from these two capacitors counteract each other at the input of the comparator 100. The actual bridge ratio can be estimated by studying the digital output signal from the SAR ADC Ai and estimating to what degree the test sequence p[n] appears in said digital output signal from the SAR ADC Ai. This can be done by correlating the digital output signal of the SAR ADC Ai with the test sequence p[n]. The resulting correlation can be used as an estimate of said degree to which the test sequence p[n] appears in the output signal of the SAR ADC Ai. The two capacitors may be designed such that said contributions cancel at the input of the comparator 100 if the bridge ratio has just the right value (i.e. the value it is intended to have). In that case, the test sequence p[n] does not appear at all in the digital output signal from the SAR ADC Ai. However, if there is a deviation from the intended bridge ratio, the contributions will not cancel perfectly at the input of the comparator 100, and a nonzero residue of the test sequence p[n] remains in the output signal of the SAR ADC Ai. A measure of how large this residue is, or in other words a measure of the aforementioned degree, such as said correlation, can be used to estimate how much the bridge ratio deviates from the intended value. Such embodiments are described below with reference to FIG. 13.

According to some embodiments, the SAR ADC Ai comprises a test sequence interface 200 configured to provide a binary test sequence p[n] during a plurality of consecutive sampling clock periods. In some embodiments, the binary test sequence p[n] is provided at all time when the SAR ADC Ai is in operation, whereby said plurality of consecutive sampling clock periods is, in some sense, all sampling clock periods. In other embodiments, the binary test sequence p[n] is only applied during certain test intervals. In these cases, the plurality of consecutive sampling clock periods refers to the sampling clock periods within one such test interval. Each of the plurality of sampling clock periods, identified by the sequence index n, has an associated sample of the binary test sequence p[n]. In some examples below, where operation during a specific sampling clock period is described, the associated sample (i.e. associated with that sampling clock period) is sometimes referred to as the "current sample". In some embodiments, the SAR ADC Ai comprises a test signal generator circuit 210 that is configured to generate the binary test sequence p[n] and supply it to the test signal interface 200. In other embodiments, the binary test sequence p[n] is supplied to the test signal interface by a test signal generator external to the SAR ADC Ai. For example, the TI ADC 50 may comprise a test signal generation circuit that is common to all the sub ADCs A1-AM. In other embodiments, the test signal generation circuit may be external to the TI ADC 50. In some embodiments, the binary test sequence p[n] is a pseudo-random binary sequence (PRBS). In such embodiments, the test signal generator circuit 210 may be implemented as a PRBS generator, for instance using a linear-feedback shift register. In some embodiments, the binary test sequence p[n] may be pre-generated and stored in a memory of the test signal generator circuit 210. A PRBS is suitable for estimating the bridge ratio error during "normal operation" of the SAR ADC Ai, where an input signal that can have a significantly higher magnitude than the residue of the binary test sequence p[n] (e.g. measured at the input of the comparator 100) is present. A PRBS is generally uncorrelated to the input signal, and its residue can therefore be recovered from the output signal of the SAR ADC Ai by means of correlation.

According to some embodiments, the first capacitor network 130 comprises a first test-signal capacitor $C_{T1}$ and a second test signal capacitor $C_{T2}$. The first test-signal capacitor $C_{T1}$ has a first and a second terminal, wherein the first terminal is connected to the first node 140 of the first capacitor network 130. Similarly, the second test-signal capacitor $C_{T2}$ has a first and a second terminal, wherein the first terminal is connected to the second node 150 of the first capacitor network 130. For each of the plurality of consecutive sampling clock periods, the second terminal of the first test-signal capacitor $C_{T1}$ is configured to be supplied with a first voltage $V_1[n]$ in representing the associated sample of the binary test sequence p[n], and the second terminal of the second test-signal capacitor $C_{T2}$ is configured to be supplied with a second voltage $V_2[n]$, also representing the associated sample of the binary test sequence p[n], such that a contribution of the first voltage $V_1[n]$ at the input of the comparator 100 is counteracted.

In the following, it is assumed that the sizes of the test signal capacitors are selected such the contribution from the second voltage $V_2[n]$ cancels the contribution from the first voltage $V_1[n]$ at the input of the comparator if the bridge ratio is just right, i.e. that the voltage gain from the second terminal of the second test signal capacitor $C_{T2}$ to the input of the comparator 100 is equal to the voltage gain from the second terminal of the first test-signal capacitor $C_{T1}$ to the input of the comparator 100. There are some different ways in which the first and second voltages $V_1[n]$ and $V_2[n]$ can be selected and supplied such that the above-mentioned counteraction is obtained. A few of these are mentioned below. For example, the first and second voltages $V_1[n]$ and $V_2[n]$ may have the same amplitude and the capacitors $C_{T1}$ and $C_{T2}$ may be designed to yield the same voltage gain to the comparator input. This can, for instance, be obtained by using the bridged capacitor bank second from the top of FIG. 8 (BS=4). Here, $C_{T2}$ corresponds to the capacitance of 8C. $C_{T1}$ does not have any corresponding capacitor in FIG. 8, but has to be added to the first node 140 with a capacitance of C. Adding capacitance to the first node 140 does not affect the bridge ratio. $C_{T1}$ and $C_{T2}$ present a unity weighted contribution at the input of the comparator and the remaining binary weighted capacitors present a binary weighted contribution at the input of the comparator. Part or all of the additional capacitor with capacitance 6C can, in some embodiments, be realized as the second capacitor network 180.

In some embodiments, the first voltage $V_1[n]$ and the second voltage $V_2[n]$ are selected from a positive reference voltage $+V_{ref}$ and a negative reference voltage $-V_{ref}$ in response to the binary test sequence p[n]. A '0' sample in the sequence may correspond to one of $+V_{ref}$ and $-V_{ref}$. A '1' sample in the sequence may correspond to the other one of +$V_{ref}$ and −$V_{ref}$. FIG. 200 illustrates that the test signal interface may be configured to control switches to connect the second terminals of $C_{T1}$ and $C_{T2}$ to +$V_{ref}$ or −$V_{ref}$ in response to the test sequence p[n].

In some embodiments, the second terminal of the first test-signal capacitor $C_{T1}$ is configured to be supplied with the first voltage $V_1$[n] in one of the first phase and the second phase of the sampling clock period and the second terminal of the second test-signal capacitor $C_{T2}$ is configured to be supplied with the second voltage $V_2$[n] in the same one of the first phase and the second phase of the sampling clock period. In these embodiments, the first voltage $V_1$[n] and the second voltage $V_2$[n] have opposite polarity in order to counteract each other's contributions at the input of the comparator 100. For example, if, for the first voltage $V_1$[n], a '0' in the test sequence p[n] corresponds to $V_1$[n]=−$V_{ref}$ and a '1' in the test sequence p[n] corresponds to $V_1$[n]=+$V_{ref}$, then, for the second voltage $V_2$[n], a '0' in the test sequence p[n] corresponds to $V_2$[n]=+$V_{ref}$ and a '1' in the test sequence p[n] corresponds to $V_2$[n]=−$V_{ref}$.

Figure 13:
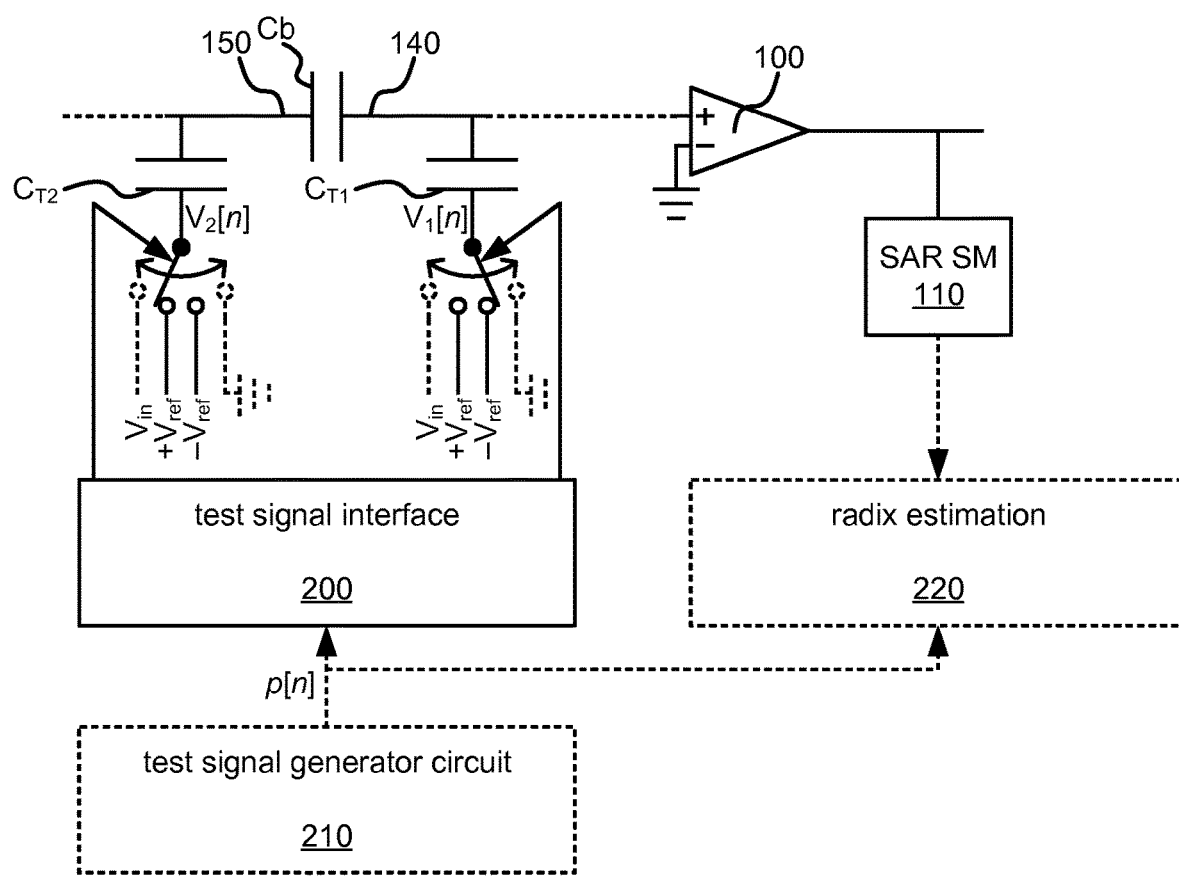
FIG. 13 illustrates circuitry for applying a test signal.

For instance, the second terminal of $C_{T1}$ may be configured to be selectively (in response to the current sample of the test sequence p[n]) supplied with one of +$V_{ref}$ and −$V_{ref}$ and the second terminal of $C_{T2}$ may be configured to be selectively supplied with the other one of +$V_{ref}$ and −$V_{ref}$ in the first phase of the sampling clock period, e.g. under control of the test signal interface 200. The second terminals of $C_{T1}$ and $C_{T2}$ may be configured to be connected to ground during the second phase of the sampling clock period. FIG. 13 illustrates this possibility with optional connections to ground in the switches connected to the second terminals of $C_{T1}$ and $C_{T2}$. During the first phase of the sampling clock period, any deviation from the desired bridge ratio will manifest itself as a residue of the current sample of the test sequence p[n] that is superpositioned onto the current sample of the input signal of the SAR ADC Ai, and remains so during the second phase of the sampling clock signal.

Alternatively, in some embodiments, the second terminal of $C_{T1}$ may be configured to be selectively (in response to the current sample of the test sequence p[n]) supplied with one of +$V_{ref}$ and −$V_{ref}$ and the second terminal of $C_{T2}$ may be configured to be selectively supplied with the other one of +$V_{ref}$ and −$V_{ref}$ in the second phase of the sampling clock period, e.g. under control of the test signal interface 200. The second terminals of $C_{T1}$ and $C_{T2}$ may be configured to be connected to ground or to the receive the input voltage $V_{in}$, during the first phase of the sampling clock period. In the latter case, $C_{T1}$ and $C_{T2}$ contributes to the sampling of the input voltage $V_{in}$, and may thus be utilized in the coarse gain control of the SAR ADC Ai. FIG. 13 illustrates this latter possibility by including optional connections to $V_{in}$, in the switches connected to the second terminals of $C_{T1}$ and $C_{T2}$. In these embodiments, residue of the current sample of the test sequence p[n] is superpositioned onto the current sample of the input signal of the SAR ADC Ai in the second phase of the sampling clock signal (since this is when the test sequence p[n] is applied).

In some embodiments, the second terminal of the first test-signal capacitor $C_{T1}$ is configured to be supplied with the first voltage $V_1$[n] in one of the first phase and the second phase of the sampling clock period and the second terminal of the second test-signal capacitor $C_{T2}$ is configured to be supplied with the second voltage $V_2$[n] in the other one of the first phase and the second phase of the sampling clock period. In these embodiments, the first voltage $V_1$[n] and the second voltage have the same polarity in order to counteract each other's contributions at the input of the comparator 100. For example, if, for the first voltage $V_1$[n], a '0' in the test sequence p[n] corresponds to $V_1$[n]=−$V_{ref}$ and a '1' in the test sequence p[n] corresponds to $V_1$[n]=+$V_{ref}$, then, for the second voltage, a '0' in the test sequence p[n] also corresponds to $V_2$[n]=−$V_{ref}$ and a '1' in the test sequence p[n] also corresponds to $V_2$[n]=+$V_{ref}$.

For instance, the second terminal of $C_{T1}$ may be configured to be selectively (in response to the current sample of the test sequence p[n]) supplied with one of +$V_{ref}$ and −$V_{ref}$ in the first phase of the sampling clock period, and the second terminal of $C_{T2}$ may be configured to be selectively supplied with the same one of +$V_{ref}$ and −$V_{ref}$ in the second phase of the sampling clock period, e.g. under control of the test signal interface 200. The second terminal of $C_{T1}$ may be configured to be connected to ground during the second phase of the sampling clock period. The second terminal of $C_{T2}$ may be configured to be connected to ground or to receive the input voltage $V_{in}$, during the first phase of the sampling clock period. In the latter case, $C_{T2}$ contributes to the sampling of the input voltage $V_{in}$, and may thus be utilized in the coarse gain control of the SAR ADC Ai. During the first phase of the sampling clock period, a contribution from the first voltage $V_1$[n] is superpositioned onto the current sample of the input signal of the SAR ADC Ai. During the second phase of the sampling clock signal, a corresponding contribution from the second voltage $V_2$[n] is subtracted therefrom, and a residue of the current sample of the test sequence p[n], which is indicative of the deviation from the intended bridge ratio, remains superpositioned onto the current sample of the input signal.

Alternatively, in some embodiments, the second terminal of $C_{T1}$ may be configured to be selectively (in response to the current sample of the test sequence p[n]) supplied with one of +$V_{ref}$ and −$V_{ref}$ in the second phase of the sampling clock period, and the second terminal of $C_{T2}$ may be configured to be selectively supplied with the same one of +$V_{ref}$ and −$V_{ref}$ in the first phase of the sampling clock period, e.g. under control of the test signal interface 200. The second terminal of $C_{T2}$ may be configured to be connected to ground during the second phase of the sampling clock period. The second terminal of $C_{T1}$ may be configured to be connected to ground or to the receive the input voltage $V_{in}$, during the first phase of the sampling clock period. In the latter case, $C_{T1}$ contributes to the sampling of the input voltage $V_{in}$, and may thus be utilized in the coarse gain control of the SAR ADC Ai. During the first phase of the sampling clock period, a contribution from the second voltage $V_2$[n] is superpositioned onto the current sample of the input signal of the SAR ADC Ai. During the second phase of the sampling clock signal, a corresponding contribution from the first voltage $V_1$[n] is subtracted therefrom, and a residue of the current sample of the test sequence p[n], which is indicative of the deviation from the intended bridge ratio, remains superpositioned onto the current sample of the input signal.

As indicated in FIG. 13, the SAR ADC Ai may comprise circuitry 220 configured to estimate the bridge ratio based on output samples the SAR ADC generated during said plurality of sampling clock periods. Alternatively, this circuitry 220 may be external to the SAR ADC Ai. For instance, the TI ADC 50 (FIG. 3) may comprise such circuitry configured to estimate the bridge ratio that is common to all sub ADCs A1-AM. Alternatively, the bridge ratio estimation may be performed externally to the TI ADC 50, such as in the DSP circuit 15 (FIG. 2).

An example of how the bridge ratio estimation can be performed is provided in the following. If the two capacitors $C_{T1}$ and $C_{T2}$ have been designed to yield the same voltage gain to the comparator input the binary test sequence p[n] is cancelled and not visible in the digital output data of the SAR ADC Ai. On the other hand, if a residual of the binary test sequence p[n] is present at the output, the bridge ratio must be corrected. The bridge ratio error can be estimated by means of correlating the SAR ADC Ai output with the binary test sequence p[n]. The correlation output will be proportional to the bridge ratio mismatch. Below, the ADC output signal is $s_c[n] = s_{in}[n] + w s_{pn}[n] (r_b - 1)$ where $s_{in}$ is the output of the SAR ADC Ai in the absence of the binary test sequence p[n] and $s_{pn}(\in\{-1,1\})$ is a numerical equivalent of the binary test sequence p[n] (p[n]='0' corresponds to $s_{pn}[n]=-1$, p[n]='1' corresponds to $s_{pn}[n]=1$). The number $r_b$ is a normalized bridge ratio quantity that ideally should be unity, in which case there will be no residue of $s_{pn}[n]$ in $s_c[n]$. The coefficient w is a weight of the binary test sequence p[n], that indicates the nominal transfer of the sequence $s_{pn}[n]$ from the second terminal of the capacitor $C_{T1}$ to the digital output of the SAR ADC Ai as well as from the second terminal of the capacitor $C_{T2}$ to the digital output of the SAR ADC Ai. As an explanation of w, consider, for instance, a hypothetical situation where the sequence $s_{pn}[n]$ is input to the second terminal of $C_{T1}$ in the form of the voltage $V_1[n] = V_{ref} s_{pn}[n]$, the second terminal of $C_{T2}$ is kept grounded, and the input voltage $v_{in}$ is held constantly 0. Furthermore, for this hypothetical situation, let us denote the output signal from the SAR ADC Ai y[n] in order to not confuse it with the above defined output signal $s_c[n]$ when the SAR ADC Ai is in actual use. This digital output signal is $y[n] = w s_{pn}[n]$, or in other words $w = y[n]/s_{pn}[n]$.

The bridge ratio deviation $\Delta r_b = r_b - 1$ may be calculated by correlation as:

$$\Delta r_b = \frac{E[s_c s_{pn}]}{\sqrt{E[w^2 s_{pn}^2]}} = [E[s_{pn}^2] = 1] = E[s_c s_{pn}]/w$$

For estimation based on a finite set of N samples this bridge ratio deviation can be estimated as $$\Delta \hat{r}_b = \frac{1}{wN} \sum_{n=1}^{N} s_c[n] s_{pn}[n]$$

The bridge capacitor $C_b$ can be implemented as a variable capacitor configured to be controlled via a digital bridge ratio setting parameter $r_s$. For example, $C_b$ can be implemented as a capacitor bank with a number of capacitors that can be selectively connected in parallel in response to $r_s$ such that an increase in $r_s$ leads to a decrease in $C_b$, and thus a larger bridge ratio, and a decrease in $r_s$ leads to an increase $C_b$, and thus a smaller bridge ratio. Such digitally controllable variable capacitors are, per se, well known and not described in any further detail herein. For each estimation of the bridge ratio deviation $\Delta \hat{r}_b$, the bridge ratio setting $r_s$ (not to be confused with the actual bridge ratio $r_b$) can be updated as $r_s = r_s/(1 + \alpha \Delta \hat{r}_b) \approx r_s (1 - \alpha \Delta \hat{r}_b)$ with $0 < \alpha < 1$. In other words, if the bridge ratio is found to be larger than the nominal value, i.e. $\Delta \hat{r}_b > 0$, the bridge ratio setting is reduced by a proportion of $|\Delta \hat{r}_b|$, and if the bridge ratio is found to be smaller than the nominal value, i.e. $\Delta \hat{r}_b < 0$, the bridge ratio setting is increased by a proportion of $|\Delta \hat{r}_b|$. More generally, this may be viewed as an optimization problem based on a noisy metric ($\Delta \hat{r}_b$) and where the relation between the actual bridge ratio and the bridge ratio setting is not necessarily proportional or even linear. As such, there exist many established methods in the field of optimization and this is not further discussed herein.

$C_{T2}$ may also be defined to have a value giving a weight different from that of $C_{T1}$. In this case, the binary test sequence p[n] will not be fully cancelled, rather the correct bridge ratio will be obtained when there is a specific level of the binary test sequence p[n] left at the digital output data of the SAR ADC Ai. Instead the cancellation of the binary test sequence p[n] can be completed in digital domain. As the cancellation is not complete it will consume a small fraction of the full-scale range. One reason to give different weights to $C_{T1}$ and $C_{T2}$ is that $C_{T1}$ has a smaller capacitance than $C_{T2}$ and thus will have a larger capacitance variation in fabrication (mismatch). A larger $C_{T1}$ will lead to a smaller relative capacitance variance and thus will improve accuracy.

The bridge ratio error may be calibrated in the analog domain, e.g. by adjusting the bridge capacitor $C_b$ as described above. Alternatively, the bridge ratio error may be compensated for in the digital domain by digital post processing of the output signal from the SAR ADC Ai. For instance, let $d_j$ denote the bits of the output $Y = \Sigma_j w_j d_j$ from the SAR ADC Ai with nominal weights $w_j$, for instance $w_j = 2^{j-1}$ for a binary-weighted architecture with a nominal bridge ratio of 2. A compensated output $\hat{Y}$ can be calculated as $\Sigma_j \hat{w}_j d_j$, where $\hat{w}_j$ are compensated bit weights computed in response to the estimated bridge ratio. For instance, the compensated bit weights can be computed as $\hat{w}_j = c_{SDAC} w_j$ for bits $d_j$ of the SDAC and as $\hat{w}_j = c_{MDAC} w_j$ for bits $d_j$ of the MDAC, where $C_{SDAC}$ and $C_{MDAC}$ are compensation factors derived from the estimated bridge ratio $\hat{r}_b = 1 + \Delta \hat{r}_b$ such that $$\frac{c_{SDAC}}{c_{MDAC}} = \hat{r}_b.$$

In some embodiments, either $C_{SDAC}$ or $C_{MDAC}$ is set to 1.

The SAR ADC Ai may be comprised in a receiver circuit 40, either as a stand-alone ADC or as a sub ADC in another ADC, such as the TI ADC 50. Furthermore, the SAR ADC Ai, may be comprised in an electronic apparatus, either as a separate component or as a part of another circuit, such as the receiver circuit 40 or the TI ADC 50. The electronic apparatus can e.g. be a communication apparatus, such as the wireless communication device 1 or the base station 2 for a cellular communications system.

The disclosure above refers to specific embodiments. However, other embodiments than the above described are possible within the scope of the invention. The different features of the embodiments may be combined in other combinations than those described. For instance, some embodiments described above provides gain-control functionality by means of the second capacitor network 180. Furthermore, some embodiment described above provides test-sequence injection functionality by means of test signal capacitors $C_{T1}$ and $C_{T2}$. It should be noted that some embodiments can include only one of these functionalities, whereas some embodiments can include both of the functionalities in combination.

The invention claimed is:
1. A successive-approximation, SAR, analog-to-digital converter, ADC, comprising:
an input for receiving an input voltage;
a comparator;
a SAR state machine connected to an output of the comparator;

a first switch network configured to be controlled by the SAR state machine and connected to the input of the SAR ADC and to reference voltage nodes; and
a first capacitor network, the first capacitor network comprising:
a first node connected to an input of the comparator;
a second node;
a bridge capacitor connected between the first node and the second node;
a first set of capacitors having a first and a second terminal, the first terminal of each capacitor in the first set is connected to the first node and the second terminal of each capacitor in the first set is connected to the first switch network; and
a second set of capacitors having a first and a second terminal, the first terminal of each capacitor in the second set is connected to the second node and the second terminal of each capacitor in the first set is connected to the first switch network;
a first test-signal capacitor having a first and a second terminal, wherein the first terminal is connected to the first node of the first capacitor network; and
a second test-signal capacitor having a first and a second terminal, wherein the first terminal is connected to the second node of the first capacitor network;
the SAR state machine is configured to control the first switch network such that:
the input voltage is sampled on one or more of the capacitors in the union of the first and the second set during a first phase of a sampling clock period; and
SAR analog-to-digital, A/D, conversion is performed during a subsequent second phase of the sampling clock period;
a second capacitor network connected to the second node of the first capacitor network and configured to control a gain of the SAR ADC;
a test sequence interface configured to provide a binary test sequence during a plurality of consecutive sampling clock periods, each of the plurality of sampling clock periods has an associated sample of the binary test sequence;
for each of the plurality of consecutive sampling clock periods:
the second terminal of the first test-signal capacitor is configured to be supplied with a first voltage representing the associated sample of the binary test sequence; and
the second terminal of the second test-signal capacitor is configured to be supplied with a second voltage representing the associated sample of the binary test sequence, such that a contribution of the first voltage at the input of the comparator is counteracted.

2. The SAR ADC of claim 1, wherein the second capacitor network comprises a capacitor ladder.

3. The SAR ADC of claim 2, wherein the capacitor ladder comprises a set of k connection points, in the following numbered from 1 to k, wherein
the 1:st connection point is connected to the second node of the first capacitor network;
for each j=1, . . . , k–1, the capacitor ladder comprises a bridge capacitor connected between connection point j and connection point j+1; and
for each j=1, . . . , k, the capacitor ladder comprises a j:th capacitor having a first terminal connected to connection point j.

4. The SAR ADC of claim 3, wherein the second capacitor network comprises a capacitor connected between connection point k and a ground node.

5. The SAR ADC (Ai) of claim 3, comprising a second switch network, wherein:
for each j=1, . . . , k, the second switch network comprises a j:th switch configured to:
connect a second terminal of the j:th capacitor of the second capacitor network to a ground node during the second phase of the sampling clock period; and
selectively connect the second terminal of the j:th capacitor of the second capacitor network to the ground node or the input of the SAR ADC during the first phase of the sampling clock period to control the gain of the SAR ADC.

6. The SAR ADC of claim 5, wherein the SAR ADC comprises a third switch network configured to connect the k connection points of the second capacitor network to the ground node during the first phase of the sampling clock period and to disconnect the k connection points of second capacitor network from the ground node during the second phase of the sampling clock period.

7. The SAR ADC of claim 1, wherein the second capacitor network comprises a capacitor connected between connection point 1 and a ground node.

8. The SAR ADC of claim 1, wherein the first voltage and the second voltage are selected from a positive reference voltage and a negative reference voltage in response to the binary test sequence.

9. The SAR ADC of claim 1, wherein the second terminal of the first test-signal capacitor is configured to be supplied with the first voltage in one of the first phase and the second phase of the sampling clock period, the second terminal of the second test-signal capacitor is configured to be supplied with the second voltage in the same one of the first phase and the second phase of the sampling clock period, and the first voltage and the second voltage have opposite polarity.

10. The SAR ADC of claim 1, wherein the second terminal of the first test-signal capacitor is configured to be supplied with the first voltage in one of the first phase and the second phase of the sampling clock period the second terminal of the second test-signal capacitor is configured to be supplied with the second voltage in the other one of the first phase and the second phase of the sampling clock period, and the first voltage and the second voltage have the same polarity.

11. The SAR ADC of claim 1, wherein the binary test sequence is a pseudo-random binary sequence.

12. The SAR ADC of claim 1, comprising circuitry configured to estimate a bridge ratio based on output samples the SAR ADC generated during said plurality of sampling clock periods.

13. Verve SAR ADC of claim 1, wherein the SAR ADC is included in a time interleaved ADC as a sub ADC, the time interleaved ADC having a plurality of sub ADCs.

14. A receiver circuit comprising one of:
a successive-approximation, SAR, analog-to-digital converter, ADC, comprising:
an input for receiving an input voltage;
a comparator;
a SAR state machine connected to an output of the comparator;
a first switch network configured to be controlled by the SAR state machine and connected to the input of the SAR ADC and to reference voltage nodes; and
a first capacitor network, the first capacitor network comprising:

a first node connected to an input of the comparator;
a second node;
a bridge capacitor connected between the first node and the second node;
a first set of capacitors having a first and a second terminal, the first terminal of each capacitor in the first set is connected to the first node and the second terminal of each capacitor in the first set is connected to the first switch network;
a second set of capacitors having a first and a second terminal, the first terminal of each capacitor in the second set is connected to the second node and the second terminal of each capacitor in the first set is connected to the first switch network;
a first test-signal capacitor having a first and a second terminal, wherein the first terminal is connected to the first node of the first capacitor network; and
a second test-signal capacitor having a first and a second terminal, wherein the first terminal is connected to the second node of the first capacitor network;

the SAR state machine is configured to control the first switch network (120) such that:
  the input voltage is sampled on one or more of the capacitors in the union of the first and the second set during a first phase of a sampling clock period; and
  SAR analog-to-digital, A/D, conversion is performed during a subsequent second phase of the sampling clock period;
a second capacitor network connected to the second node of the first capacitor network and configured to control a gain of the SAR ADC;
a test sequence interface configured to provide a binary test sequence during a plurality of consecutive sampling clock periods, each of the plurality of sampling clock periods has an associated sample of the binary test sequence;
for each of the plurality of consecutive sampling clock periods:
  the second terminal of the first test-signal capacitor is configured to be supplied with a first voltage representing the associated sample of the binary test sequence; and
  the second terminal of the second test-signal capacitor is configured to be supplied with a second voltage representing the associated sample of the binary test sequence, such that a contribution of the first voltage at the input of the comparator is counteracted; and
a plurality of SAR ADCs forming a time interleaved ADC.

15. An electronic apparatus comprising one of:
a successive-approximation, SAR, analog-to-digital converter, ADC, comprising:
  an input for receiving an input voltage;
  a comparator;
  a SAR state machine connected to an output of the comparator;
  a first switch network configured to be controlled by the SAR state machine and connected to the input of the SAR ADC and to reference voltage nodes; and
  a first capacitor network, the first capacitor network comprising:
    a first node connected to an input of the comparator;
    a second node;
    a bridge capacitor connected between the first node and the second node;
    a first set of capacitors having a first and a second terminal, the first terminal of each capacitor in the first set is connected to the first node and the second terminal of each capacitor in the first set is connected to the first switch network;
    a second set of capacitors having a first and a second terminal, the first terminal of each capacitor in the second set is connected to the second node and the second terminal of each capacitor in the first set is connected to the first switch network;
    a first test-signal capacitor having a first and a second terminal, wherein the first terminal is connected to the first node of the first capacitor network; and
    a second test-signal capacitor having a first and a second terminal, wherein the first terminal is connected to the second node of the first capacitor network;
  the SAR state machine is configured to control the first switch network (120) such that:
    the input voltage is sampled on one or more of the capacitors in the union of the first and the second set during a first phase of a sampling clock period; and
    SAR analog-to-digital, A/D, conversion is performed during a subsequent second phase of the sampling clock period;
  a second capacitor network connected to the second node of the first capacitor network and configured to control a gain of the SAR ADC;
  a test sequence interface configured to provide a binary test sequence during a plurality of consecutive sampling clock periods, each of the plurality of sampling clock periods has an associated sample of the binary test sequence;
  for each of the plurality of consecutive sampling clock periods:
    the second terminal of the first test-signal capacitor is configured to be supplied with a first voltage representing the associated sample of the binary test sequence; and
    the second terminal of the second test-signal capacitor is configured to be supplied with a second voltage representing the associated sample of the binary test sequence, such that a contribution of the first voltage at the input of the comparator is counteracted; and
  a plurality of SAR ADCs forming a time interleaved ADC; and a
receiver, the receiver having one of:
  the SAR ADC; and
  a plurality of SAR ADCs forming a time interleaved ADC.

16. The electronic apparatus of claim 15, wherein the electronic apparatus is a communication apparatus.

17. The electronic apparatus of claim 16, wherein the communication apparatus is a wireless communication device for a cellular communications system.

18. The electronic apparatus of claim 16, wherein the communication apparatus is a base station for a cellular communications system.

* * * * *